(12) United States Patent
Hobbs et al.

(10) Patent No.: US 11,449,093 B2
(45) Date of Patent: Sep. 20, 2022

(54) INDEPENDENTLY-ROTATING COMPUTING DEVICE DISPLAY MOUNTING SYSTEM

(71) Applicant: Dell Products L.P., Round Rock, TX (US)

(72) Inventors: Derric Christopher Hobbs, Round Rock, TX (US); Tzu-Wei Tai, Taipei (TW)

(73) Assignee: Dell Products L.P., Round Rock, TX (US)

( * ) Notice: Subject to any disclaimer, the term of this patent is extended or adjusted under 35 U.S.C. 154(b) by 12 days.

(21) Appl. No.: 16/946,535

(22) Filed: Jun. 25, 2020

(65) Prior Publication Data

US 2021/0405685 A1 Dec. 30, 2021

(51) Int. Cl.
*G06F 1/16* (2006.01)
*H05K 5/02* (2006.01)
*G06F 1/18* (2006.01)

(52) U.S. Cl.
CPC .............. *G06F 1/1601* (2013.01); *G06F 1/18* (2013.01); *H05K 5/0234* (2013.01)

(58) Field of Classification Search
CPC .................................................. G06F 1/1632
See application file for complete search history.

(56) References Cited

U.S. PATENT DOCUMENTS

| 2010/0039758 | A1* | 2/2010 | Ozolins | F16M 11/105 |
| | | | | 361/679.21 |
| 2017/0009935 | A1* | 1/2017 | Theis | F16M 13/022 |

* cited by examiner

*Primary Examiner* — Jerry Wu
(74) *Attorney, Agent, or Firm* — Joseph Mencher

(57) ABSTRACT

A computing device display mounting system includes an offset bracket having a display system mounting member that mounts to a display stand system, and a computing device mounting member that mounts to a computing device. The computing device display mounting system also includes a rotation bracket that is movably coupled to the display system mounting member on the offset bracket such that the rotation bracket is configured to rotate relative to the offset bracket. The rotation bracket includes at least one display mounting element that is coupled to a display. The movable coupling of the rotation bracket to the display system mounting member allows the display to rotate relative to the computing device.

20 Claims, 19 Drawing Sheets

INDEPENDENTLY-ROTATING COMPUTING DEVICE DISPLAY MOUNTING SYSTEM

BACKGROUND

The present disclosure relates generally to information handling systems, and more particularly to mounting an information handling system to a display via a mounting system that rotates independently from the display.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is sometimes desirable to mount information handling systems such as, for example, desktop computing systems, to a display utilized with that desktop computing device. For example, desktop computing systems included in the OPTIPLEX® family of computing systems available from DELL® Inc. of Round Rock, Tex., United States, are provided with a compute module that may be mounted to the display utilized by that compute module via an "offset bracket" that is coupled between a display stand and the display and that supports the compute module behind the display. However, conventional offset brackets experience issues when utilized with rotatable display/display stand systems that allow the display to rotate between a landscape orientation and a portrait orientation, as the rotation of the display will result in a corresponding rotation of the offset bracket/compute module, which can cause issues with the cabling attached to and extending from the compute module (e.g., causing the connectors on those cables to be disconnected for the compute module), reduce heat dissipation in the compute module (e.g., the compute modules discussed above may provide optimal heat dissipation in a vertical orientation as opposed to a horizontal orientation), and/or cause other issues that would be apparent to one of skill in the art in possession of the present disclosure.

Accordingly, it would be desirable to provide a computing device display mounting system that addresses the issues discussed above.

SUMMARY

According to one embodiment, an Information Handling System (IHS) includes a computing device including: a processing system; and a memory system that is coupled to the processing system and that includes instructions that, when executed by the processing system, cause the processing system to perform at least one computing operation; a display stand system; a display; an offset bracket that includes: a display system mounting member that is mounted to the display stand system; and a computing device mounting member that is mounted to the computing device; and a rotation bracket that is movably coupled to the display system mounting member on the offset bracket such that the rotation bracket is configured to rotate relative to the offset bracket, wherein the rotation bracket includes: at least one display mounting element that is coupled to the display, wherein the movable coupling of the rotation bracket to the display system mounting member allows the display to rotate relative to the computing device.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
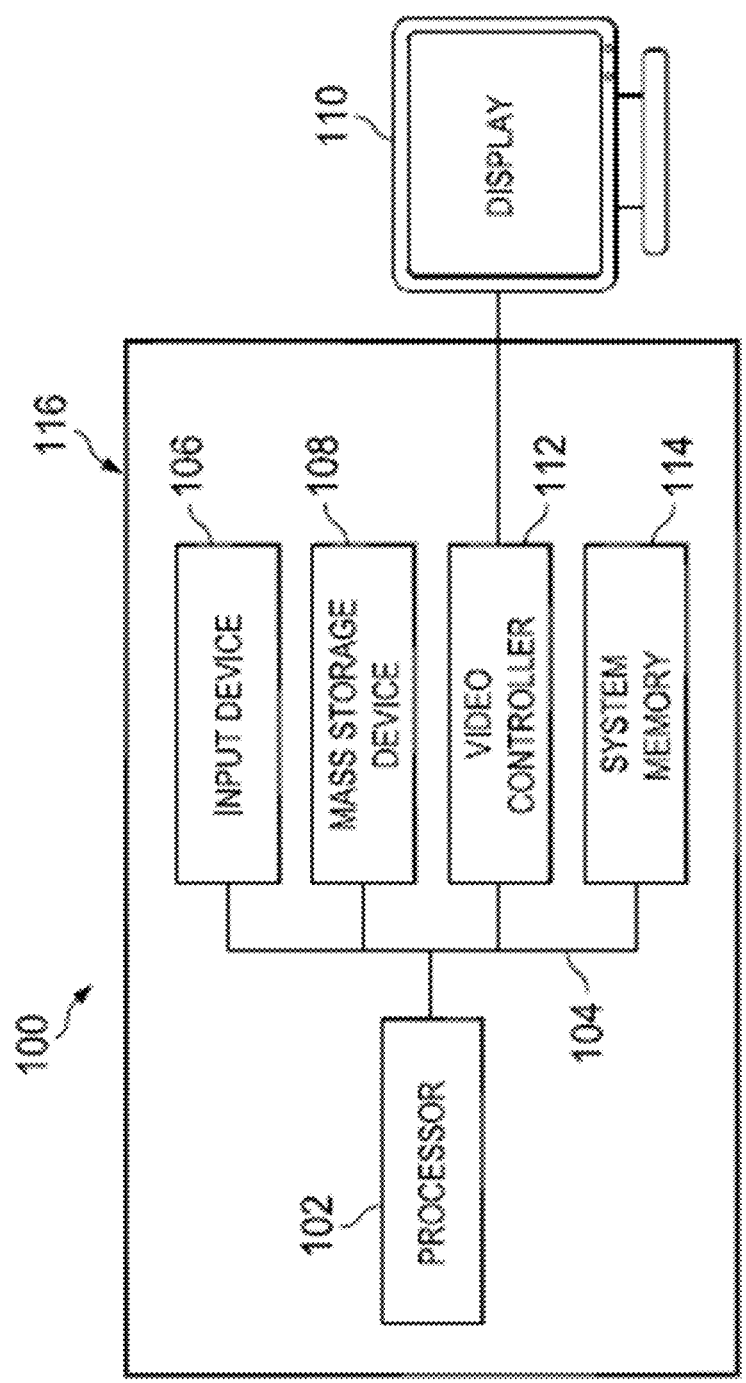
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
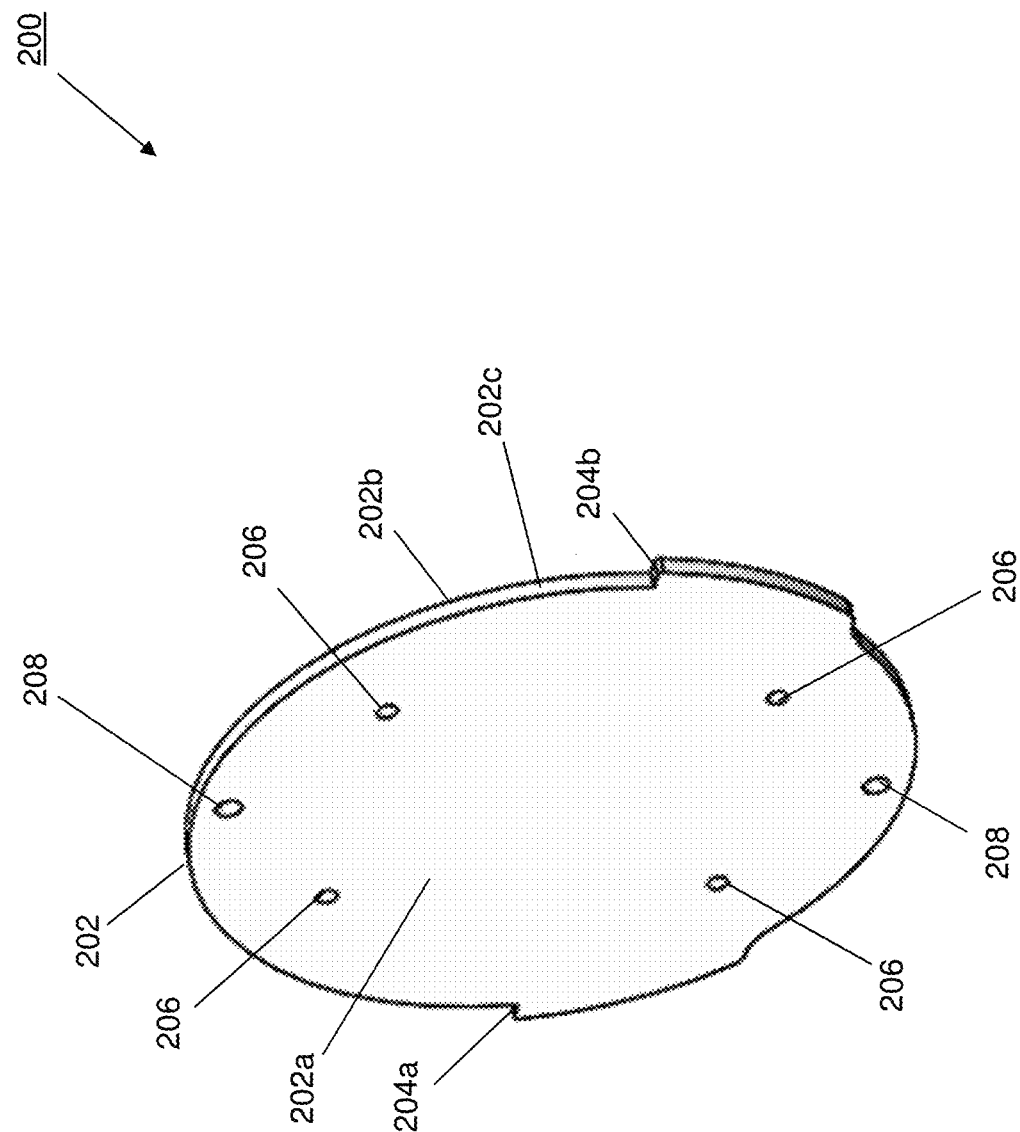
FIG. 2 is a perspective view illustrating an embodiment of a clamping plate that may be used to provide the computing device display mounting system of the present disclosure.

Referring now to FIG. 2, an embodiment of a clamping plate 200 is illustrated that may be used to provide the computing device display mounting system of the present disclosure. In the illustrated embodiment, the clamping plate 200 includes a substantially circular base 202 having a front surface 202a, a rear surface 202b that is located opposite the base 202 from the front surface 202a, and a side edge 202c that extends between the front surface 202a and the rear surface 202b. A pair of rotation stop members 204a and 204b extend from the side edge 202c and on opposite sides of the base 202 from each other. The base 202 defines a plurality of offset bracket mounting apertures 206 that extend through the base 202 from the front surface 202a to the rear surface 202b, and that are provided in a substantially square, spaced-apart orientation in the embodiment illustrated in FIG. 2. The base 202 also defines a pair of reduced-friction ring coupling apertures 208 that extend through the base 202 from the front surface 202a to the rear surface 202b, and that are spaced apart from each other on opposite sides of the base 202. However, while a specific clamping plate 200 has been illustrated and described, one of skill in the art in possession of the present disclosure will recognize that the computing device display mounting system of the present disclosure may include a variety of components and component configurations that provide the functionality of the clamping plate 200 discussed below while remaining within the scope of the present disclosure as well.

Figure 3:
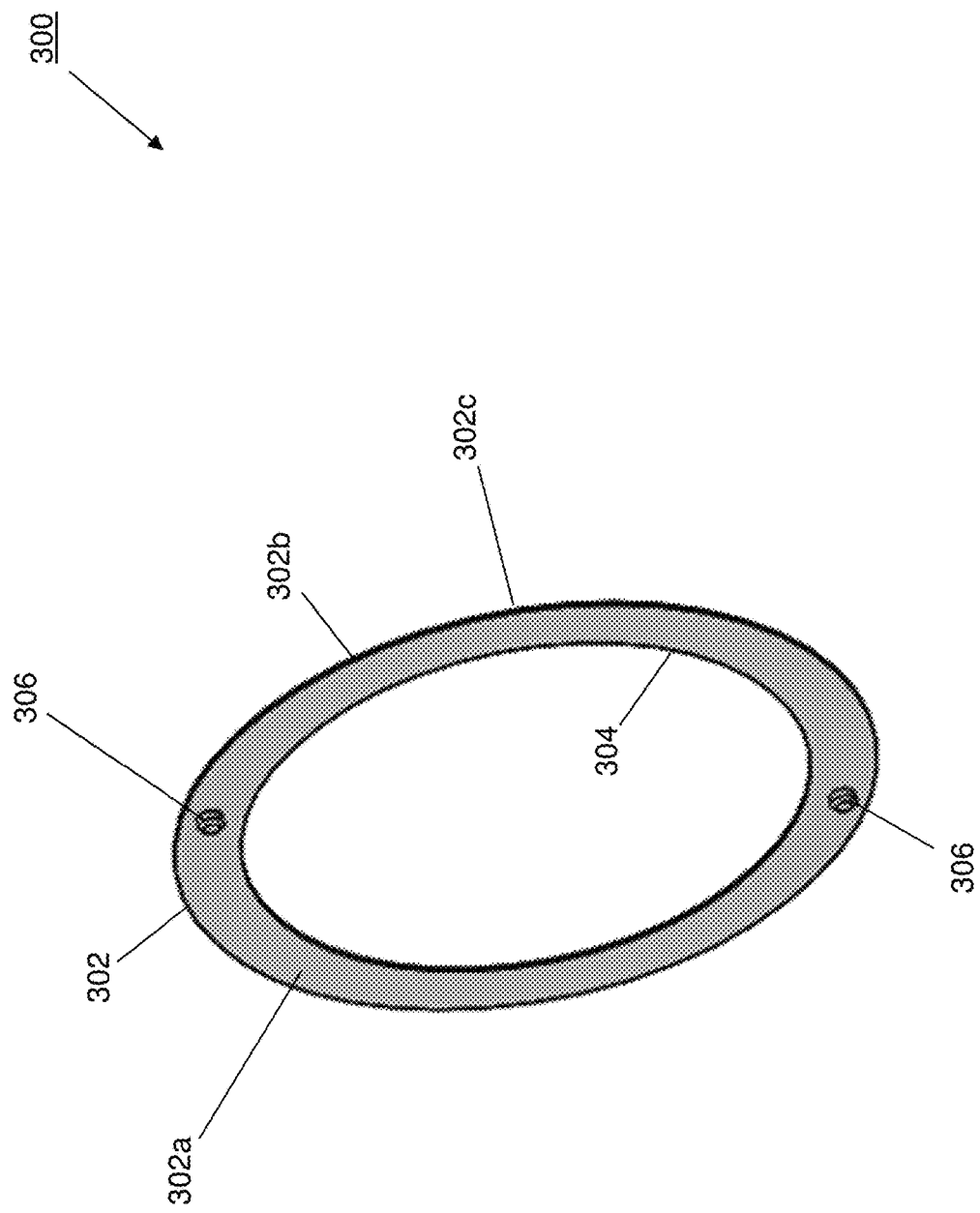
FIG. 3 is a perspective view illustrating an embodiment of a reduced-friction ring that may be used to provide the computing device display mounting system of the present disclosure.

Referring now to FIG. 3, an embodiment of a reduced-friction ring 300 is illustrated that may be used to provide the computing device display mounting system of the present disclosure. In the illustrated embodiment, the reduced-friction ring 300 includes a substantially ring-shaped base 302 having a front surface 302a, a rear surface 302b that is located opposite the base 302 from the front surface 302a, a side edge 302c that extends between the front surface 302a and the rear surface 302b, and a circular passageway 304 defined by the base 302 and extending through the base 302 from the front surface 302a to the rear surface 302b. As will be appreciated by one of skill in the art in possession of the present disclosure, the reduced-friction ring 300 may be provided using plastic materials, metal materials, and/or any of a variety of relatively low-friction materials that would be apparent to one of skill in the art in possession of the present disclosure. Furthermore, a pair of coupling members 306 extend from the front surface 302a of the base 302, are spaced apart from each other on opposite sides of the base 302, and may be utilized to couple the friction rings to multiple components in the computing device display mounting system of the present disclosure, as discussed in further detail below. However, while a specific reduced-friction ring 300 has been illustrated and described, one of skill in the art in possession of the present disclosure will recognize that the computing device display mounting system of the present disclosure may include a variety of components and component configurations that provide the functionality of the reduced friction ring 300 discussed below (e.g., by providing reduced friction surfaces on other components in the computing device display mounting system) while remaining within the scope of the present disclosure as well.

Figure 4:
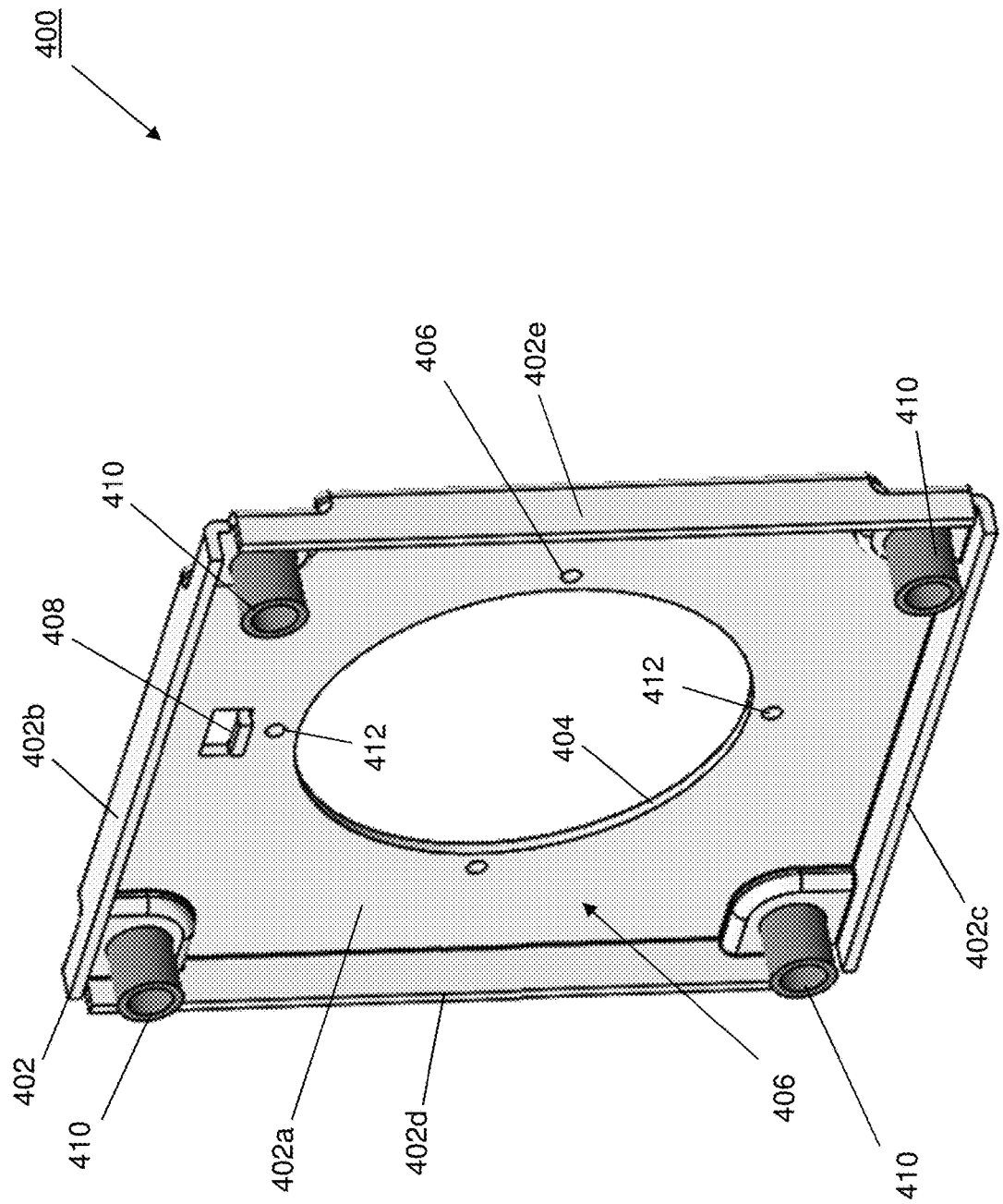
FIG. 4 is a perspective view illustrating an embodiment of a rotation bracket that may be used to provide the computing device display mounting system of the present disclosure.

Referring now to FIG. 4, an embodiment of a rotation bracket 400 is illustrated that may be used to provide the computing device display mounting system of the present disclosure. In the illustrated embodiment, the rotation bracket 400 includes a base 402 having a primary wall 402a, a top wall 402b that extends from an edge of the primary wall 402a, a bottom wall 402b that extends from an edge of the primary wall 402a opposite the top wall 402b, and a pair of side walls 402d and 402e that extend from opposite edges of the primary wall 402a and between the top wall 402b and the bottom wall 402c. A rotation bracket housing 406 is defined between the primary wall 402a, the top wall 402b, the bottom wall 402c, and the side walls 402d and 402e. The primary wall 402a defines a circular passageway 404 that extends through the primary wall 402a. A rotation stop member 408 extends from the primary wall 402a between the circular passageway 404 and the top wall 402b, and into the rotation bracket housing 406. A plurality of display mounting elements 410 extend from the primary wall 402a and out of the rotation bracket housing 406 adjacent each of the corners of the rotation bracket 400, and one of skill in the art in possession of the present disclosure will recognize how each of the display mounting elements 410 may include features for mounting a display to the rotation bracket 400 as discussed in further detail below. Finally, a pair of reduced-friction ring coupling apertures 208 are defined by the primary wall 402a and extend through the base 202 from the front surface 202a to the rear surface 202b. However, while a specific rotation bracket 400 has been illustrated and described, one of skill in the art in possession of the present disclosure will recognize that the computing device display mounting system of the present disclosure may include a variety of components and component configurations that provide the functionality of the rotation bracket 400 discussed below while remaining within the scope of the present disclosure as well.

Figure 5:
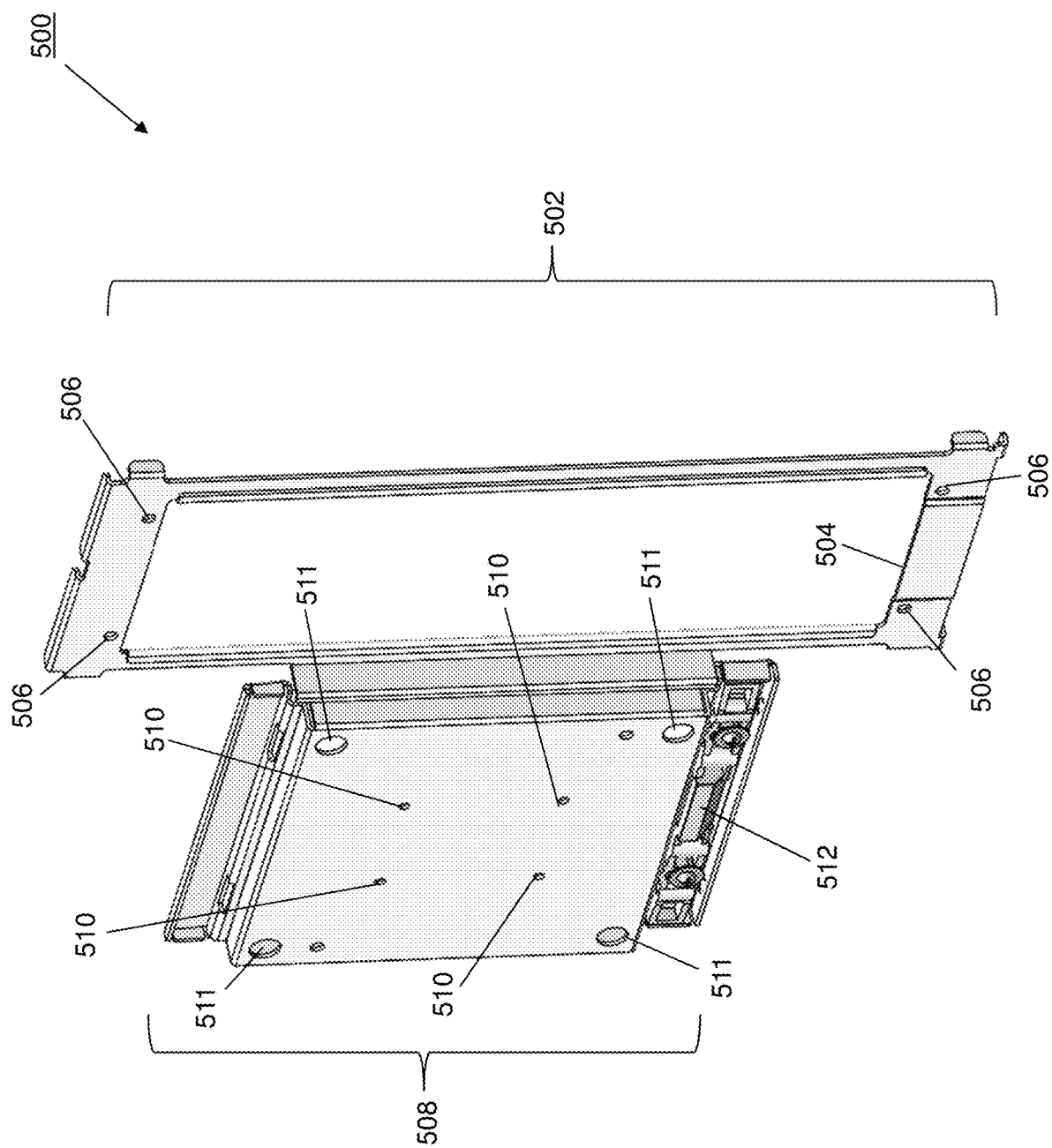
FIG. 5 is a perspective view illustrating an embodiment of an offset bracket that may be used to provide the computing device display mounting system of the present disclosure.

Referring now to FIG. 5, an embodiment of an offset bracket 500 is illustrated that may be used to provide the computing device display mounting system of the present disclosure. In the illustrated embodiment, the offset bracket 500 includes a computing device mounting member 502 that defines a computing device mounting channel 504 along its length that is configured to house at least a portion of the computing device discussed below. Furthermore, the computing device mounting member 502 also defines a plurality of computing device mounting aperture 506 that extend through the computing device mounting member 502 and that are configured to mount the computing device to the computing device mounting member 502, as discussed in further detail below. The offset bracket 500 also includes a display system mounting member 508 that extends from the computing device mounting member 502 and that defines a plurality of clamping plate mounting apertures 510 that are illustrated in FIG. 5 as spaced apart from each other in a substantially square orientation, as well as a plurality of display mounting apertures 511 that are illustrated in FIG. 5 as spaced apart from each other in a substantially square orientation as well. A display stand system latching subsystem 512 is included on the display system mounting member 508 and is discussed in further detail below. However, while a specific offset bracket 500 has been illustrated and described, one of skill in the art in possession of the present disclosure will recognize that the computing device display mounting system of the present disclosure may include a variety of components and component configurations that provide the functionality of the offset bracket 500 discussed below while remaining within the scope of the present disclosure as well.

Referring now to FIGS. 6A, 6B, 6C, 6D, 6E, 6F, and 6G, an embodiment of a computing device display mounting system 600 is illustrated that utilizes the clamping plate 200 of FIG. 2, reduced-friction rings 300 of FIG. 3, the rotation bracket 400 of FIG. 4, and the offset bracket 500 of FIG. 5.

As can be seen in the exploded and assembled views illustrated in FIGS. 6A, 6C, 6D, and 6E, the rotation bracket 400 may be positioned immediately adjacent the display system mounting member 508 on the offset bracket 500 and with a reduced-friction ring 300 positioned between them, with the clamping plate mounting apertures 510 on the display system mounting member 508 positioned adjacent the circular passageway 404 defined by the rotation bracket 400, and the coupling members 306 on the reduced-friction ring 300 aligned with the reduced-friction ring coupling apertures 208 on the rotation bracket 400. Similarly, the clamping plate 200 may then be positioned immediately adjacent the rotation bracket 400 and with a reduced-friction ring 300 positioned between them, with the offset bracket mounting apertures 206 on the clamping plate 200 aligned with the clamping plate mounting apertures 510 on the display system mounting member 508, and the coupling members 306 on the reduced-friction ring 300 aligned with the reduced-friction ring coupling apertures 208 on the clamping plate 200.

A plurality of coupling elements 602 (e.g., screws) may then be engaged with the offset bracket mounting apertures 206 on the clamping plate 200 and the clamping plate mounting apertures 510 on the display system mounting member 508 in order to secure the clamping plate 200 and the rotation bracket 400 to the display system mounting member 508 on the offset bracket 500, with the reduced friction rings 300 positioned between the rotation bracket 400 and each of the clamping plate 200 and the display system mounting member 508 on the offset bracket 500. As illustrated in FIG. 6G, with the reduced friction rings 300 positioned between the rotation bracket 400 and each of the clamping plate 200 and the display system mounting member 508 on the offset bracket 500, the coupling members 306 on one of reduced-friction rings 300 extend into the reduced-friction ring coupling apertures 208 on the rotation bracket 400 to prevent its movement relative to the rotation bracket 400, and the coupling members 306 on one of reduced-friction rings 300 extends into the reduced-friction ring coupling apertures 208 on the clamping plate 200 to prevent its movement relative to the clamping plate 200 as well. As will be appreciated by one of skill in the art in possession of the present disclosure, the reduced friction rings 300 operate to allow the rotation bracket 400 to rotate relative to the clamping plate 200 and the display system mounting member 508 on the offset bracket 500 via the reduced friction provided by the surfaces on the reduced-friction rings 300. Furthermore, one of skill in the art in possession of the present disclosure will appreciate how the securing force provided by the mounting of the clamping plate 200 to the display system mounting member 508 on the offset bracket 500 in order to compress the reduced-friction rings 300 may be adjusted to provide a friction coupling that allows the rotation bracket 400 to rotate relative to the clamping plate 200 and the offset bracket 500, while holding the rotation bracket 400 in place relative to the clamping plate 200 and the offset bracket 500 at any point along its arc of motion.

Figure 6A:
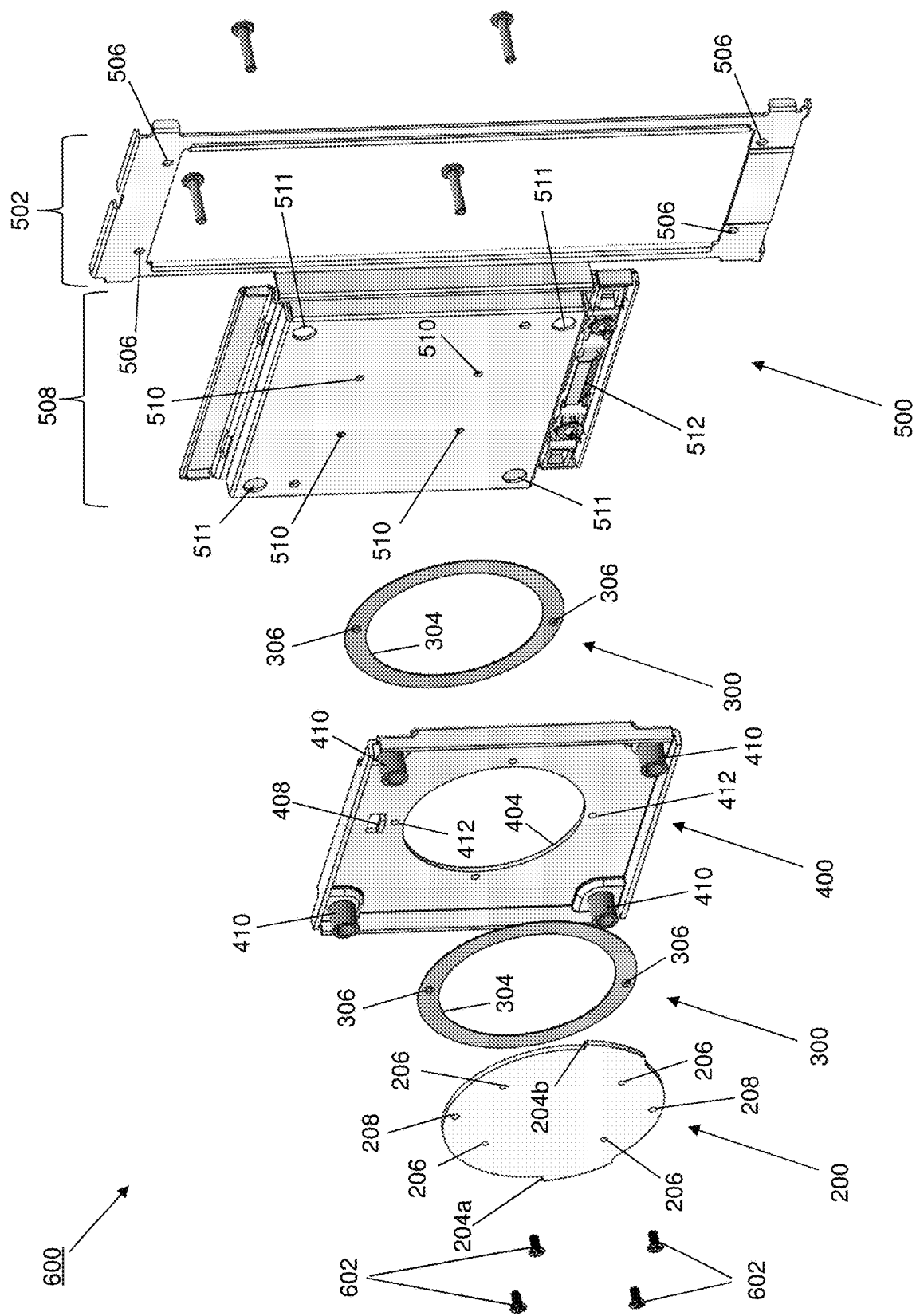
FIG. 6A is an exploded perspective view illustrating an embodiment of a computing device display mounting system including the clamping plate of FIG. 2, the reduced-friction rings of FIG. 3, the rotation bracket of FIG. 4, and the offset bracket of FIG. 5.
Figure 6B:
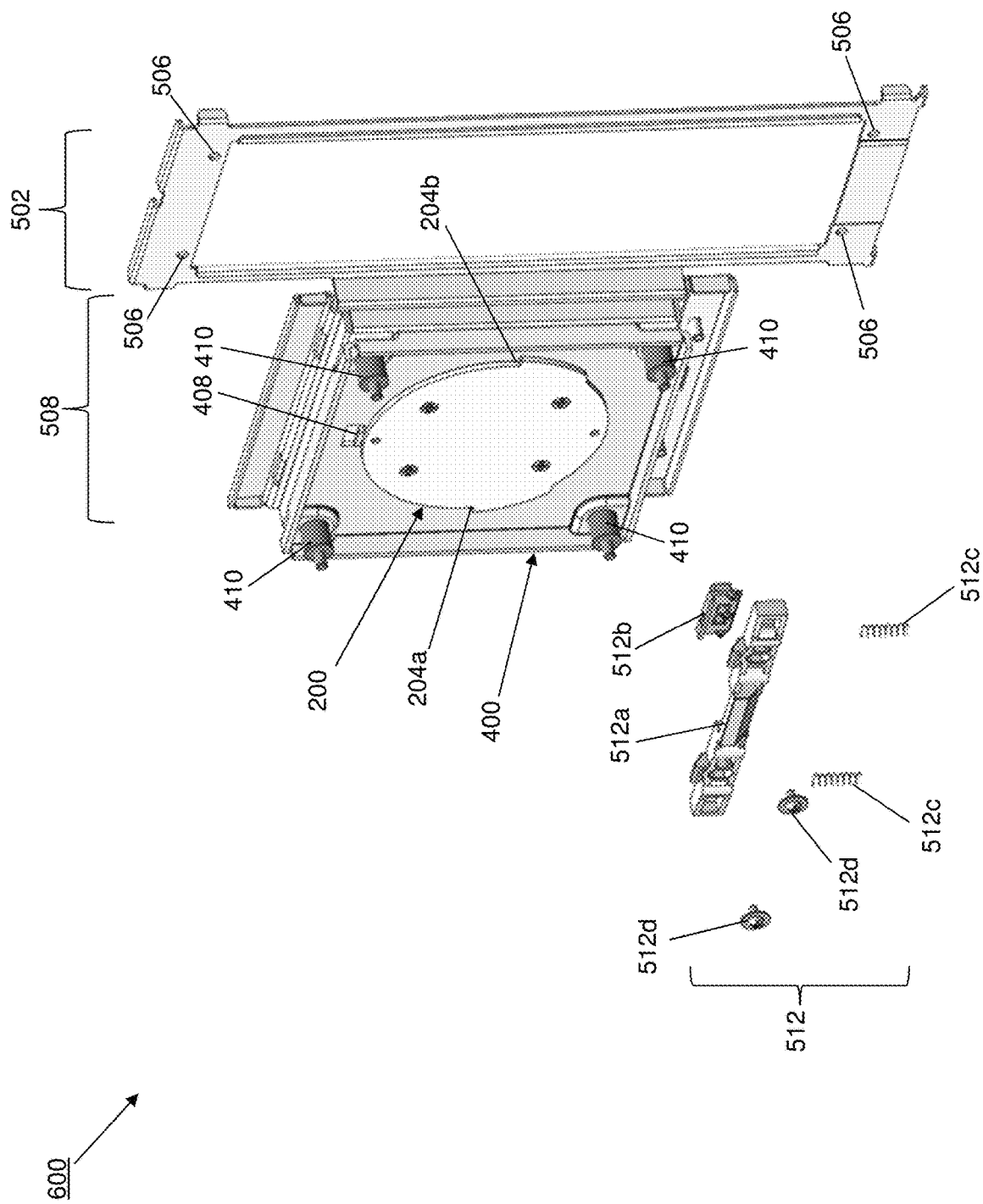
FIG. 6B is a perspective view illustrating an embodiment of the computing device display mounting system of FIG. 6A in an assembled configuration and with an exploded view of a latching subsystem on the computing device display mounting system.
Figure 6C:
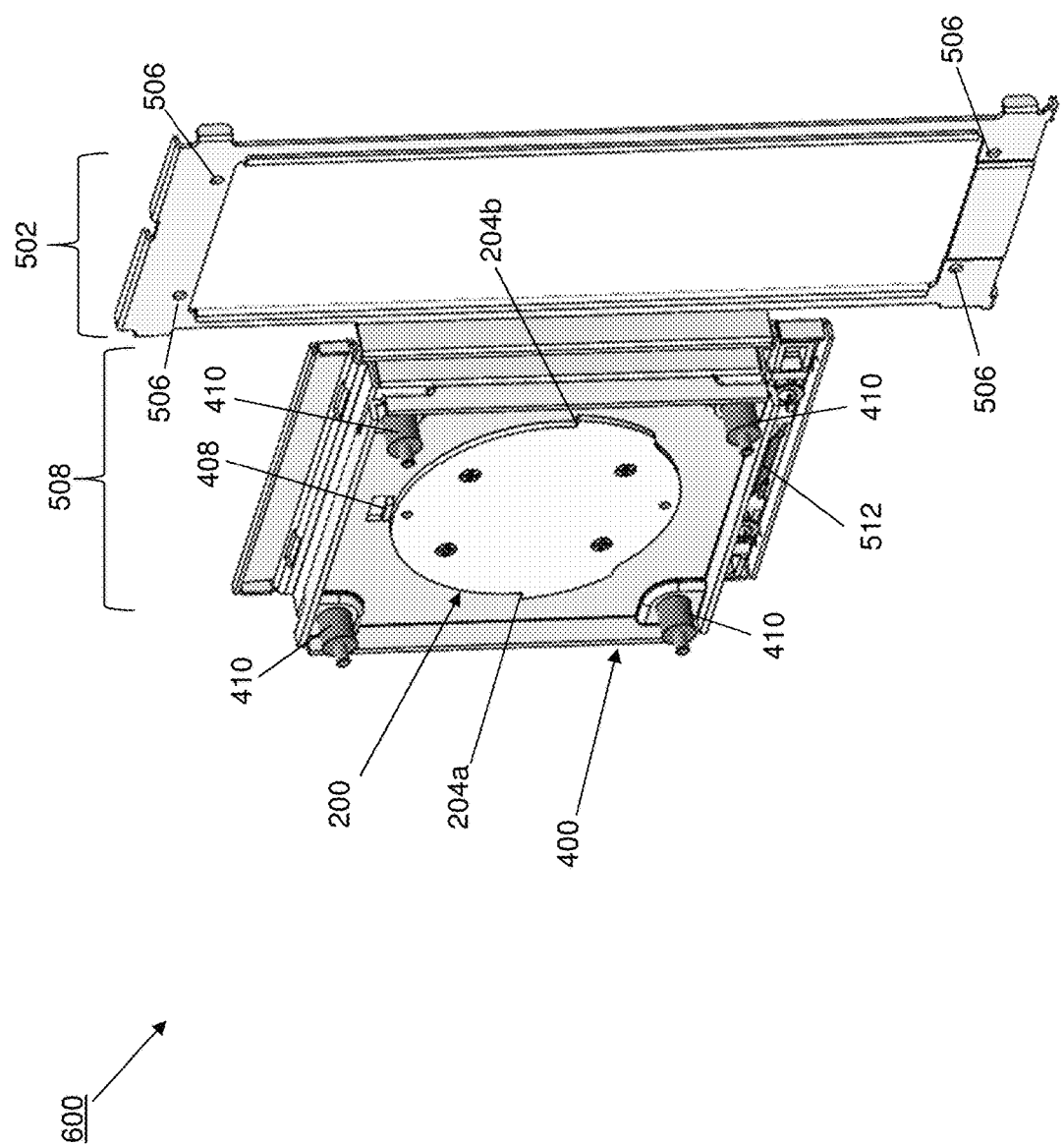
FIG. 6C is a perspective view illustrating an embodiment of the computing device display mounting system of FIG. 6A in an assembled configuration.
Figure 6D:
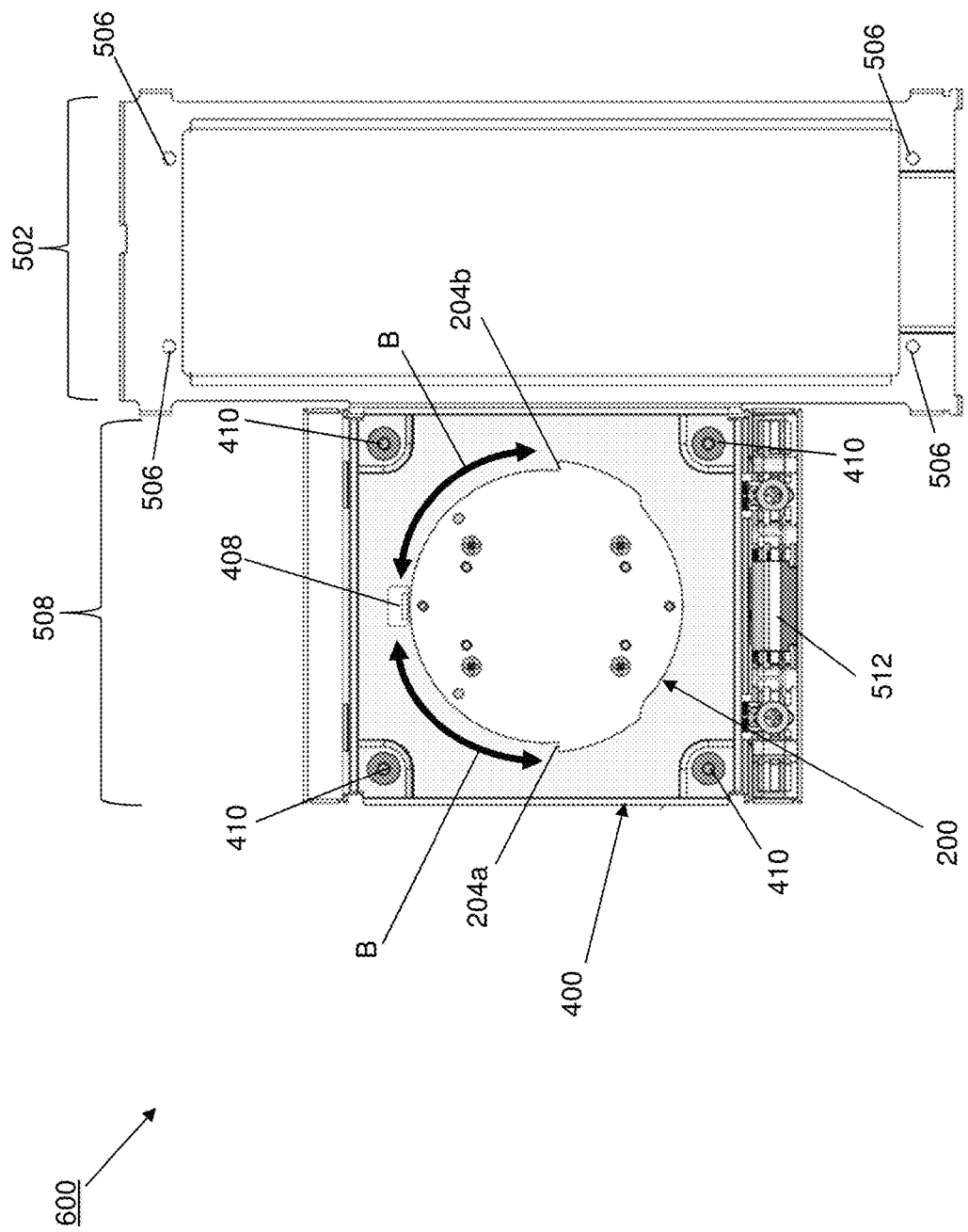
FIG. 6D is a front view illustrating an embodiment of the computing device display mounting system of FIG. 6C.
Figure 6E:
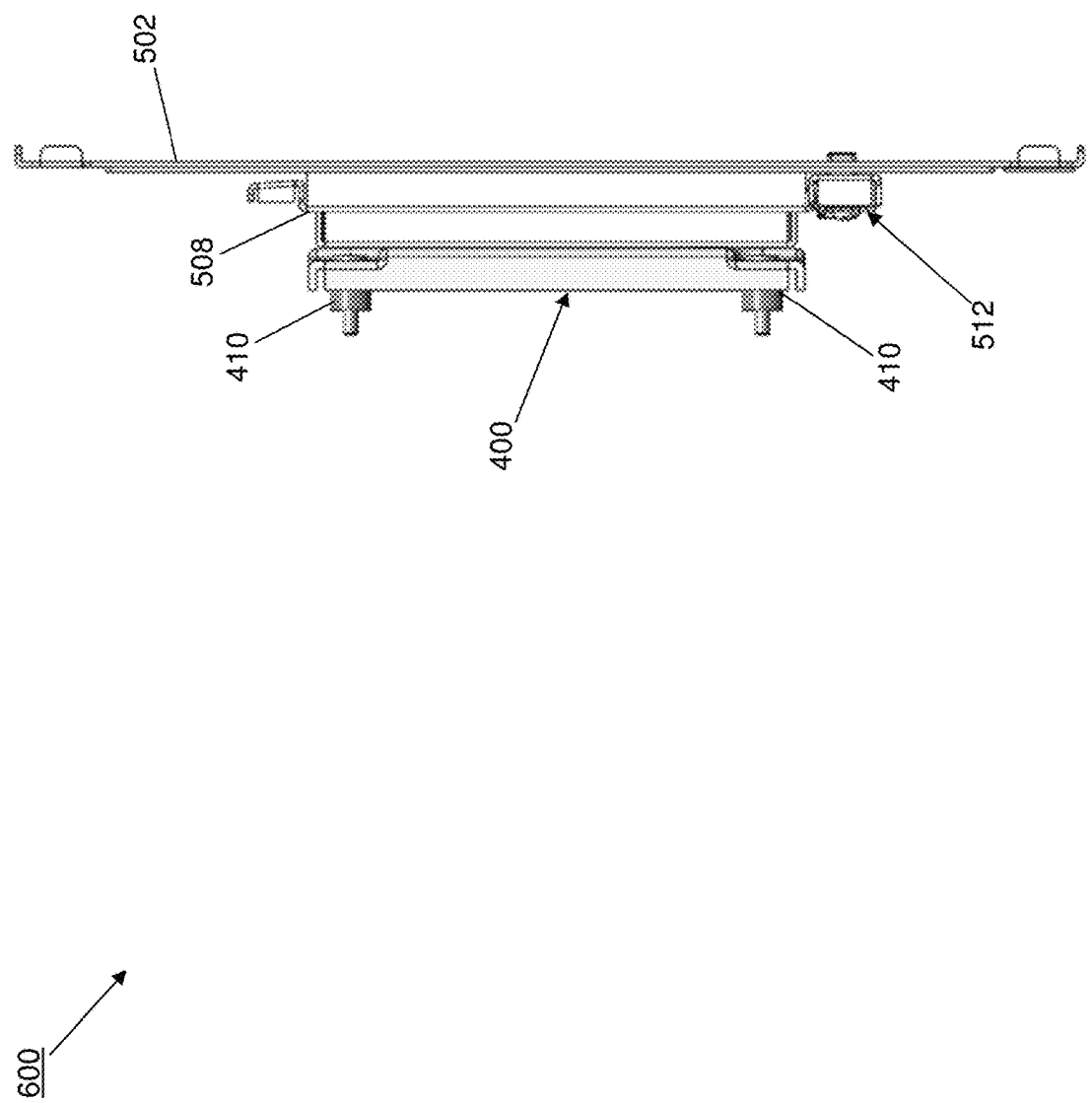
FIG. 6E is a side view illustrating an embodiment of the computing device display mounting system of FIG. 6C.
Figure 6F:
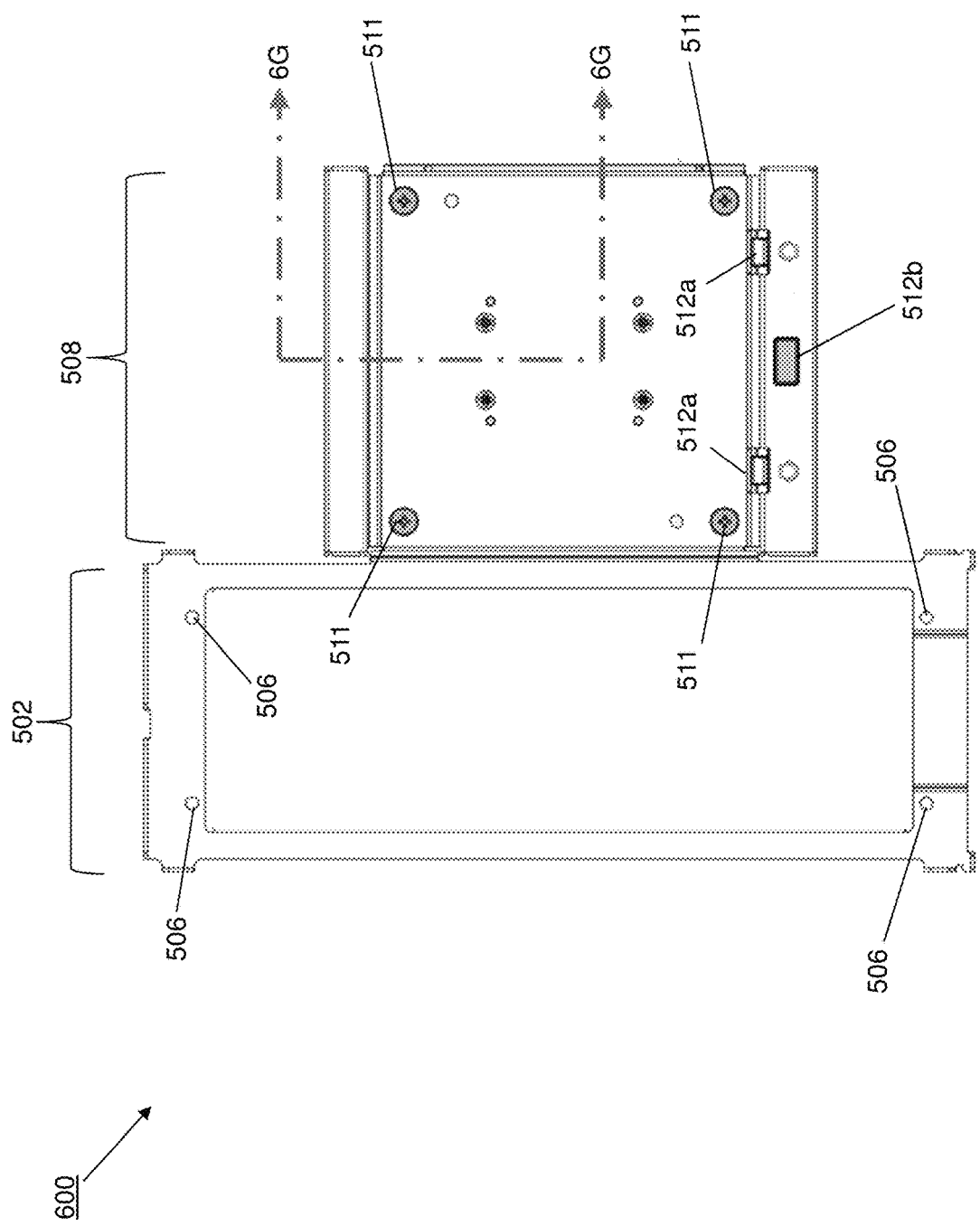
FIG. 6F is a rear view illustrating an embodiment of the computing device display mounting system of FIG. 6C.
Figure 6G:
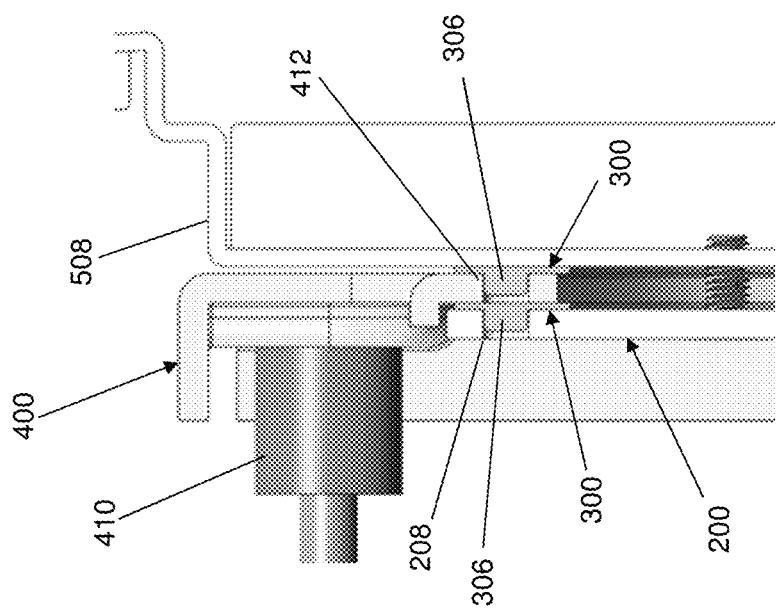
FIG. 6G is a cross-sectional view illustrating an embodiment of a portion of the computing device display mounting system of FIG. 6F.

With reference to FIG. 6B, the display stand system latching subsystem 512 is illustrated in an exploded view to illustrate how the display stand system latching subsystem 512 includes a latch member 512a and a release member 512b that is mounted to the latch member 512a, with a plurality of biasing members 512c coupled to the latch member 512a and engaging the display system mounting member 508 on the offset bracket 500 to bias the latch member into a securing orientation, and a pair of securing members 512d (e.g., screws) that secure the latch member 512a to the display system mounting member 508 on the offset bracket 500. FIG. 6F illustrates how portions of the latch member 512a and the release member 512b may extend through latching/release apertures defines by the display system mounting member 508 on the offset bracket 500. However, while a specific example of the computing device display mounting system 600 has been described, one of skill in the art in possession of the present disclosure will recognize that the computing device display mounting system of the present disclosure may include a variety of components and/or component configurations that provide the functionality below while remaining within the scope of the present disclosure as well.

Figure 7:
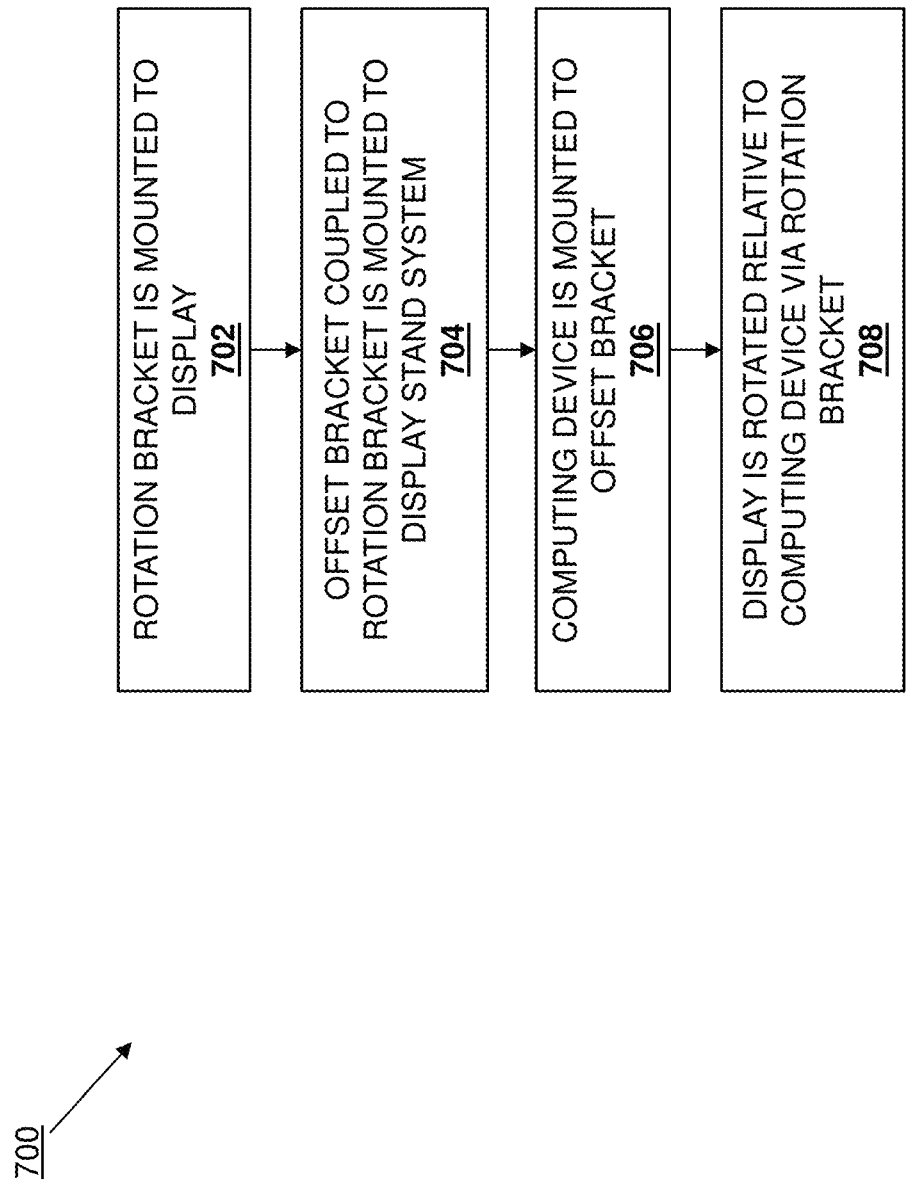
FIG. 7 is a flow chart illustrating an embodiment of a method for mounting a computing device to a display.

Referring now to FIG. 7, an embodiment of a method 700 for mounting a computing device to a display is illustrated. As discussed below, the systems and methods of the present disclosure provide for the mounting of a computing device to a display in a manner that allows the display and the computing device to rotate independently of each other. For example, the computing device display mounting system may include an offset bracket having a display system mounting member that mounts to a display stand system, and a computing device mounting member that mounts to a computing device. A rotation bracket on the computing device display mounting system is movably coupled to the display system mounting member on the offset bracket such that the rotation bracket may rotate relative to the offset bracket, and the rotation bracket includes at least one display mounting element that is coupled to a display, with the movable coupling of the rotation bracket to the display system mounting member allowing the display to rotate relative to the computing device. The relative rotation of the display and the computing device eliminates issues that are experienced in conventional computing device display mounting system with regard to the cabling attached to and extending from the computing device (e.g., that can cause the connectors on those cables to be disconnected for the computing device), may prevent the reduction of heat dissipation in the computing device (e.g., by preventing the computing device from rotating from a vertical orientation that provides optimal heat dissipation to a horizontal orientation), and can remedy other issues that would be apparent to one of skill in the art in possession of the present disclosure.

Figure 8:
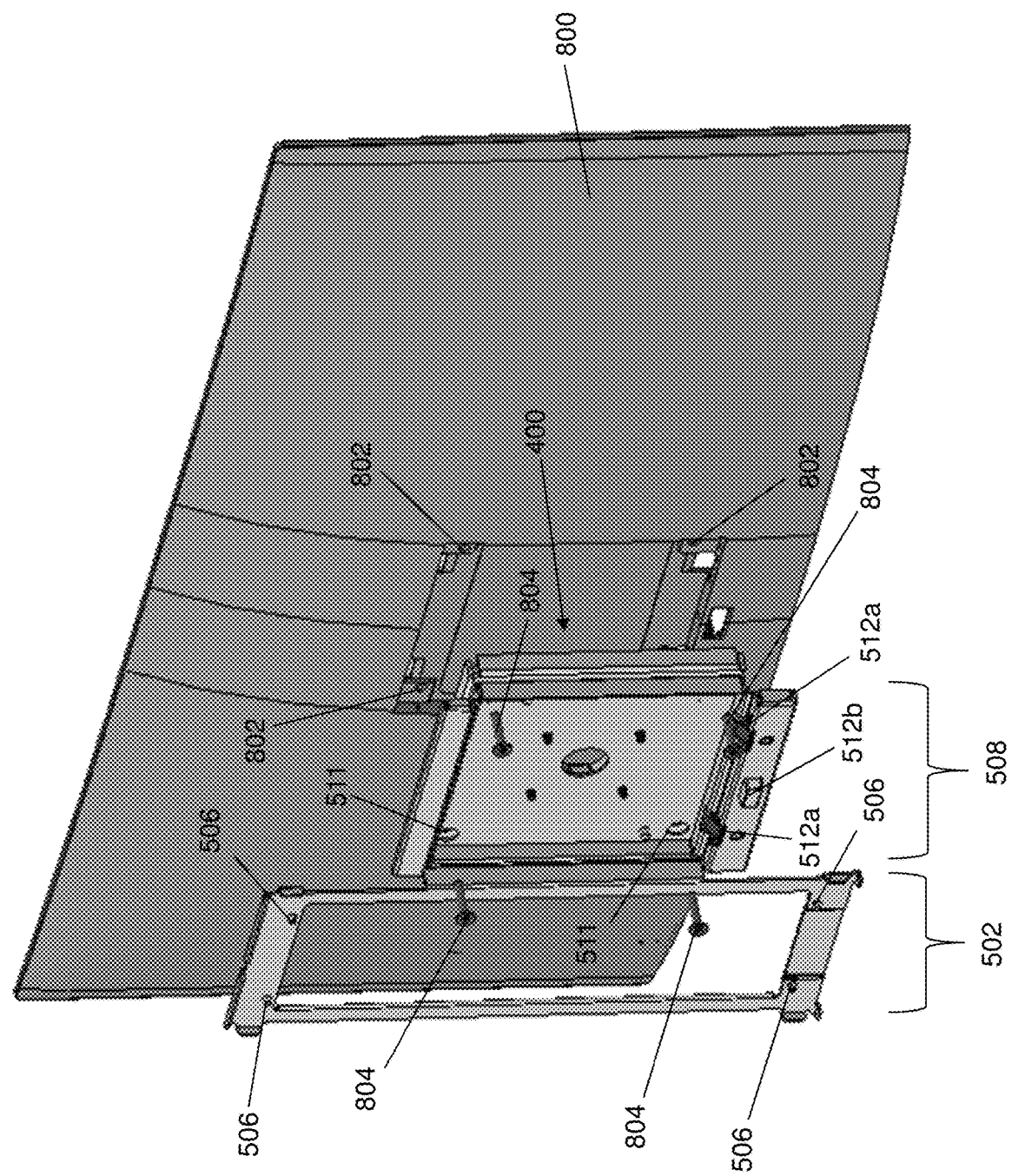
FIG. 8 is a perspective view illustrating an embodiment of the computing device display mounting system of FIGS. 6A-6G being coupled to a display.

The method 700 begins at block 702 where a rotation bracket is mounted to a display. With reference to FIG. 8, a display 800 may be provided that includes display mounting features 802 that are illustrated in FIG. 8 as display mounting apertures. In an embodiment, at block 702, the computing device display mounting system 600 may be positioned adjacent the display 800 such that the rotation bracket 400 and clamping plate 200 face the display 800, and the display mounting elements 410 on the rotation bracket 400 are aligned with the display mounting features 802 on the display 800. Coupling elements 804 (e.g., screws) may then be engaged with the display mounting apertures 511 on the display system mounting member 508, the display mounting elements 410 on the rotation bracket 400, and the display mounting features 802 on the display 800, in order to secure the computing device display mounting system 600 to the display 800.

Figure 9A:
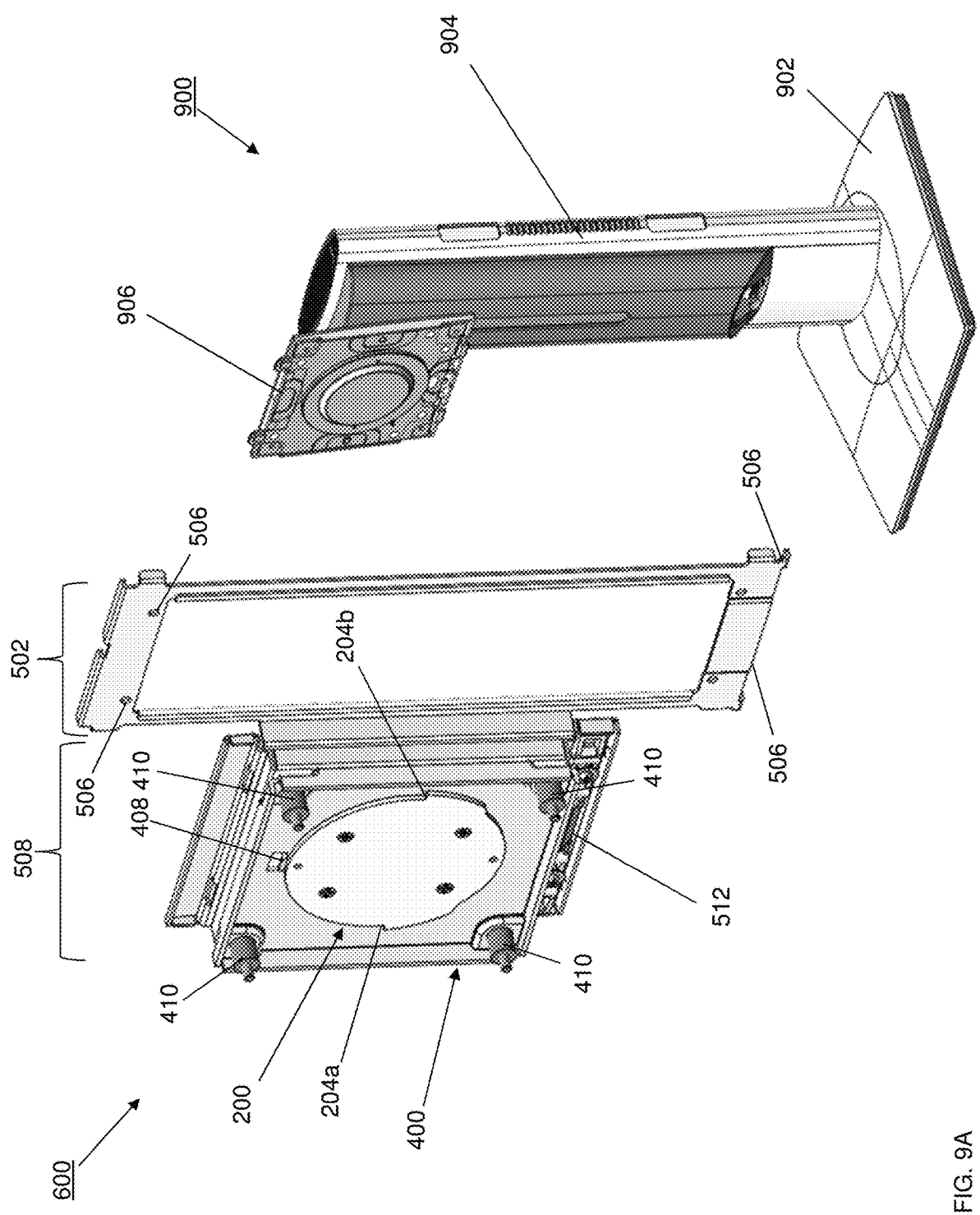
FIG. 9A is a front perspective view illustrating an embodiment of the computing device display mounting system of FIGS. 6A-6G being coupled to a display stand system.
Figure 9B:
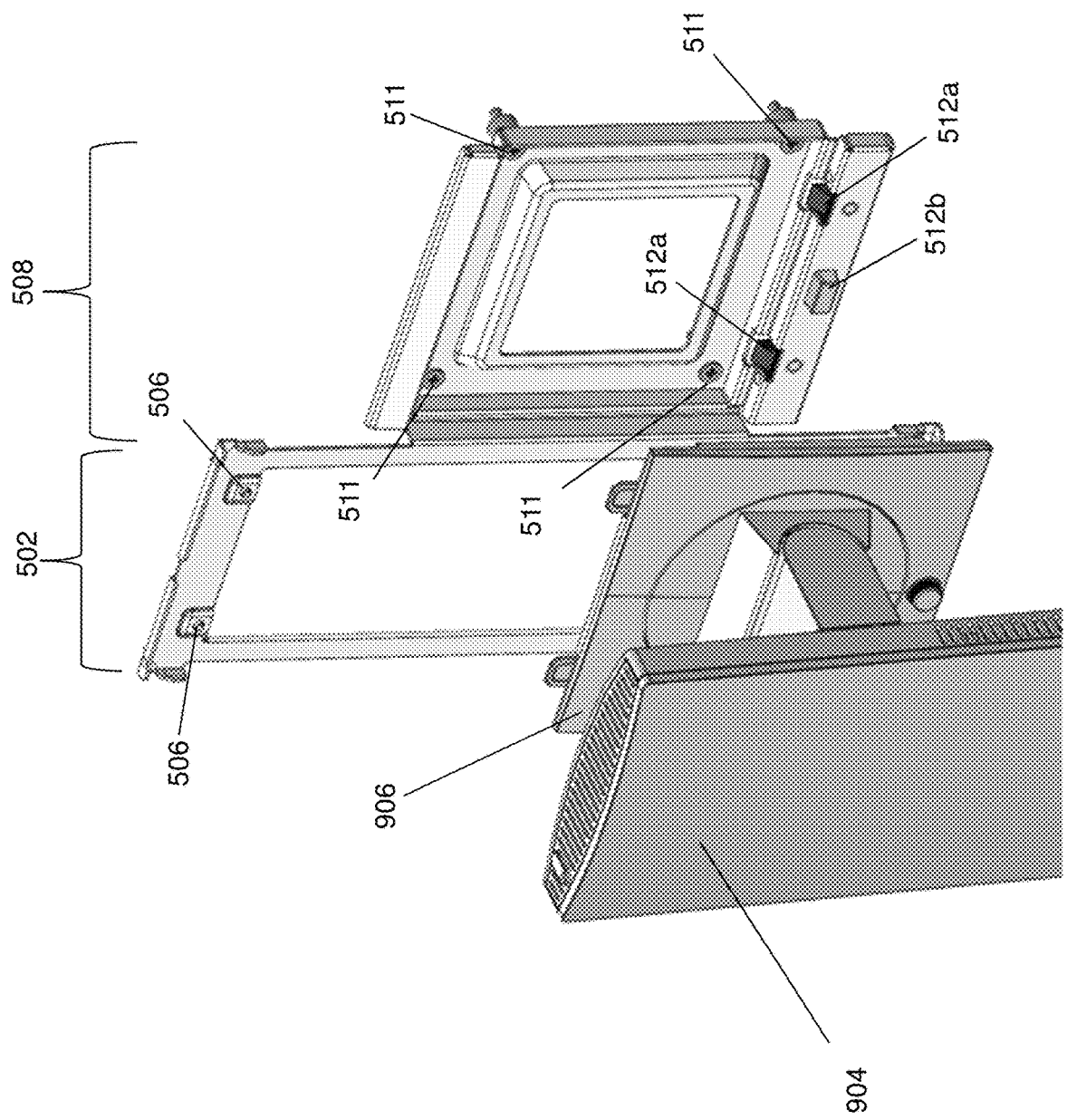
FIG. 9B is a rear perspective view illustrating an embodiment of the computing device display mounting system of FIGS. 6A-6G being coupled to a display stand system.
Figure 9C:
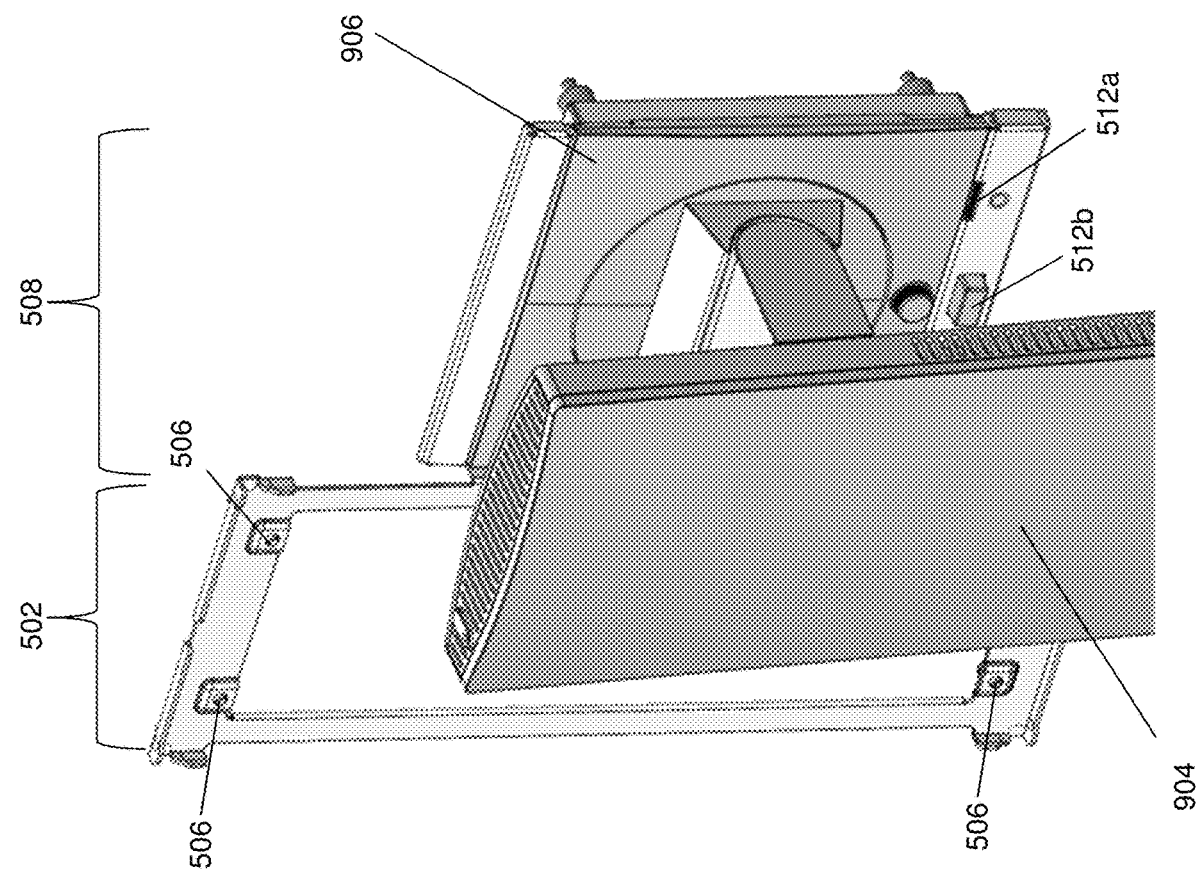
FIG. 9C is a rear perspective view illustrating an embodiment of the computing device display mounting system of FIGS. 6A-6G coupled to a display stand system.

The method 700 then proceeds to block 704 where an offset bracket that is coupled to the rotation bracket is mounted to a display stand system. With reference to FIGS. 9A, 9B, and 9C, a display stand system 900 may be provided that includes a base 902, a display stand 904 that extends from the base 902, and a display mount 906 that extends from the display stand 904 and opposite the display stand 904 from the base 902. As illustrated in FIGS. 9A and 9B, in an embodiment of block 702, the computing device display mounting system 600 (including the display 800 that is not visible in FIGS. 9A-9C for clarity) may be positioned adjacent the display stand system 900 such that the display system mounting member 508 on the offset bracket 500 is located adjacent the display mount 906, with the portions of the latch member 512a on the display stand system latching subsystem 512 that extend through the display system mounting member 508 aligned with corresponding coupling features on the display mount 906 (e.g., Video Electronics Standards Association (VESA) coupling features).

As illustrated in FIG. 9C, the computing device display mounting system 600 may then be moved towards the display stand system 900 such that the portions of the latch member 512a on the display stand system latching subsystem 512 that extend through the display system mounting member 508 operate to engage with corresponding coupling features on the display mount 906 in order to secure the computing device display mounting system 600 and the display 800 to the display stand system 900. As will be appreciated by one of skill in the art in possession of the present disclosure, actuation of the release member 512b on the display stand system latching subsystem 512 will disengage the portions of the latch member 512a on the display stand system latching subsystem 512 that extend through the display system mounting member 508 from the corresponding coupling features on the display mount 906, allowing the computing device display mounting system 600 and the display 800 to be removed from the display stand system 900.

Figure 10A:
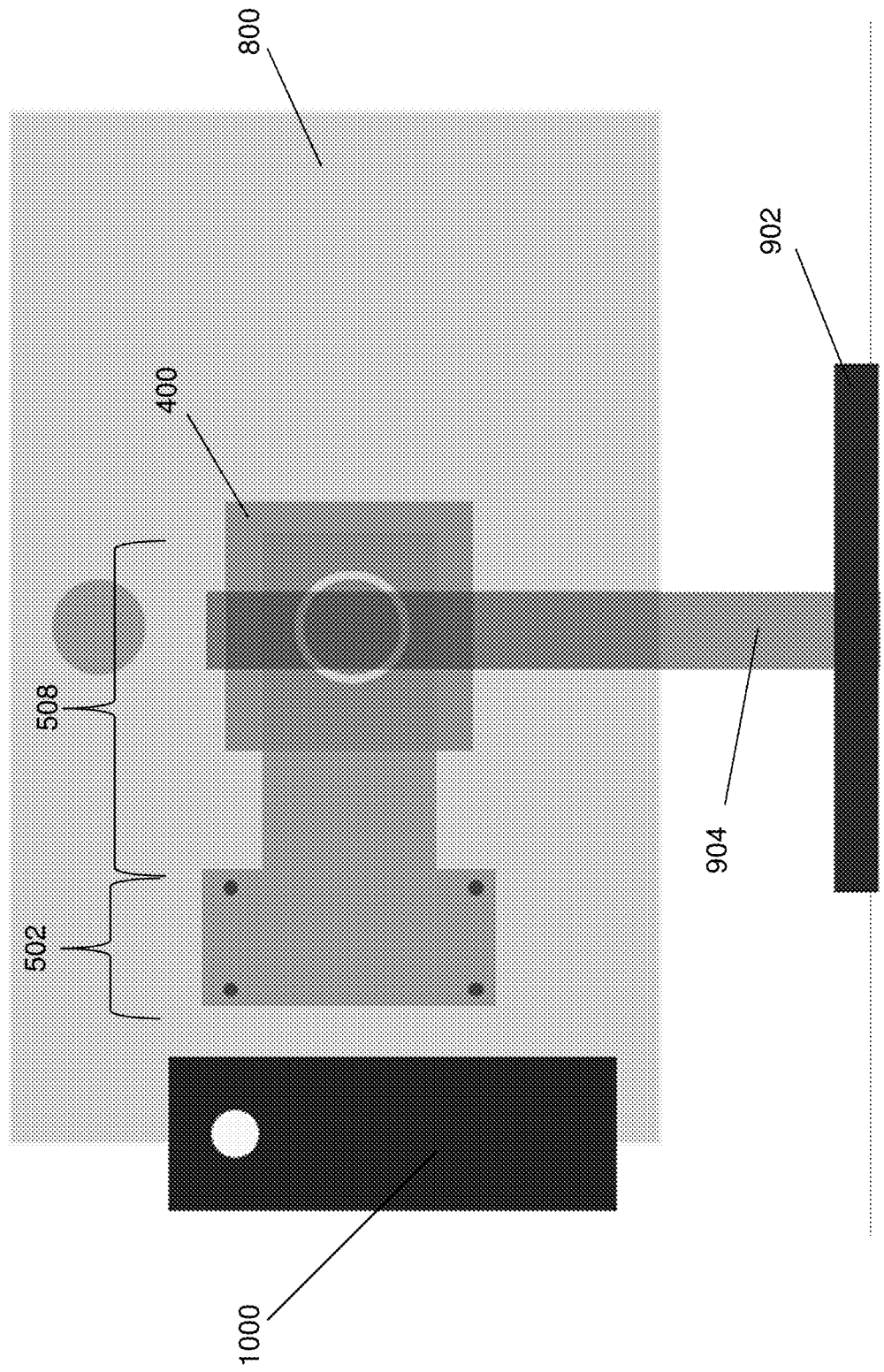
FIG. 10A is a schematic view illustrating an embodiment of a compute module being coupled to the computing device display mounting system of FIGS. 6A-6G that is coupled to the display of FIG. 8 and the display stand of FIGS. 9A-9C.
Figure 10B:
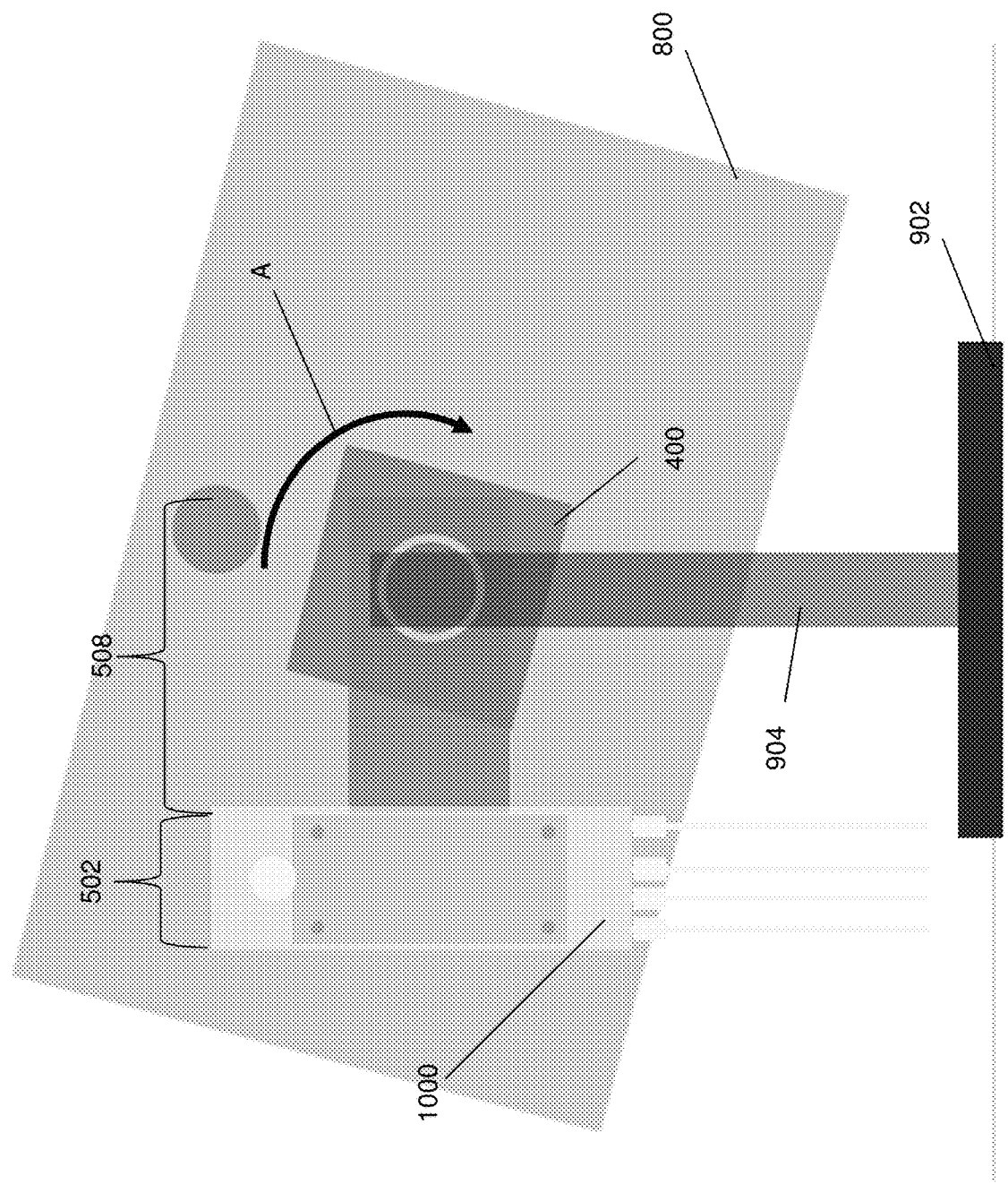
FIG. 10B is a schematic view illustrating an embodiment of the compute module coupled to the computing device display mounting system of FIGS. 6A-6G that is coupled to the display of FIG. 8 and the display stand of FIGS. 9A-9C, and with the display rotated.

The method 700 then proceeds to block 706 where a computing device is mounted to the offset bracket. As illustrated in FIG. 10A, in an embodiment of block 706, a computing device 1000 may be mounted to the offset bracket 500 by positioning the computing device 1000 adjacent the computing device mounting member 502 on the offset bracket 500 such that coupling features on the computing device 1000 (not illustrated) are aligned with the computing device mounting apertures 506 on the computing device mounting member 502. Coupling elements (e.g., screws) may then be engaged with the coupling features on the computing device 1000 and the computing device mounting apertures 506 on the computing device mounting member 502 in order to mount the computing device 1000 to the computing device mounting member 502 on the offset bracket 500, as illustrated in FIG. 10B.

The method 700 then proceeds to block 708 where the display is rotated relative to the computing device via the rotation bracket. As illustrated in FIGS. 10A and 10B, in an embodiment of block 708, the display 800 may be rotated in a direction A, and one of skill in the art in possession of the present disclosure will appreciate that the mounting of the display 800 to the rotation bracket 400 and the rotation of the display 800 causes the rotation bracket 400 to rotate relative to the offset bracket 500 due to the ability of the rotation bracket 400 to rotate relative to the offset bracket 500 via the reduced-friction rings 300, discussed above. As such, the display 800 may be rotated while the computing device 1000 mounted to the offset bracket 500 remains stationary. In the illustrated embodiment, the rotation bracket 400 and the display 800 may be configured to rotate about a predefined arc of approximately 90 degrees from the landscape orientation illustrated in FIG. 10A and into a portrait orientation. For example, each of the rotation stop members 204a and 204b on the clamping plate 200 may be configured to engage the rotation stop member 408 on the rotation bracket 400 in order to limit the arc of rotation of the rotation bracket 400 relative to the offset bracket 500 to an approximately ninety degrees arc B (illustrated in FIG. 6D) in either direction from the landscape orientation illustrated in FIG. 10A.

However, while the rotation of the display 800 between the landscape orientation to the portrait orientation has been described, one of skill in the art in possession of the present disclosure will appreciate that the computing device display mounting system 600 allows for other relative rotations between the computing device 1000 and the display 800 as well. For example, a user may wish to rotate the computing device 1000 relative to the display 800 from the vertical orientation of the computing device 1000 illustrated in FIGS. 10A and 10B, to a horizontal orientation that is approximately perpendicular to the vertical orientation, and/or to other intermediate orientations that would be apparent to one of skill in the art in possession of the present disclosure. As such, while the computing device 1000 may provide optimal heat dissipation in the vertical orientation, the computing device 1000 may be configured to dissipate sufficient heat in horizontal orientation to allow the computing device 1000 to operate properly, and thus a user that wishes to orient the computing device 1000 in orientations other than vertical may do so using the computing device display mounting system 600 and without the need for the corresponding rotation of the display 800. Furthermore, while the computing device display mounting system 600 allows independent rotation of the computing device 1000 and the display 800, rotation locking features may be provided on the rotation bracket 400 and the offset bracket 500, and may be locked to each other in a manner that requires both the rotation bracket 400 and the offset bracket 500 to rotate together, which allows for situations where a user does not want independent rotation of the computing device 1000 and the display 800.

Thus, systems and methods have been described that provide for the mounting of a computing device to a display in a manner that allows the display and the computing device to rotate independently of each other. For example, the computing device display mounting system may include an offset bracket having a display system mounting member that mounts to a display stand system, and a computing device mounting member that mounts to a computing device. A rotation bracket on the computing device display mounting system is movably coupled to the display system mounting member on the offset bracket such that the rotation bracket may rotate relative to the offset bracket, and the rotation bracket includes at least one display mounting element that is coupled to a display, with the movable coupling of the rotation bracket to the display system mounting member allowing the display to rotate relative to the computing device. The relative rotation of the display and the computing device eliminates issues experienced in conventional computing device display mounting system with the cabling attached to and extending from the computing device (e.g., that can cause the connectors on those cables to be disconnected for the computing device), may prevent the reduction of heat dissipation in the computing device (e.g., by preventing the computing device from rotating from a vertical orientation that provides optimal heat dissipation to a horizontal orientation), and can remedy other issues that would be apparent to one of skill in the art in possession of the present disclosure.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computing device display mounting system, comprising:
   an offset bracket that includes:
      a display system mounting member that is configured to mount to a display stand system; and
      a computing device mounting member that extends from the display system mounting member such that there is no relative movement between the display system mounting member and the computing device mounting member, wherein the computing device mounting member is configured to mount to a computing device such that movement of the computing device relative to the display system mounting member is prevented; and
   a rotation bracket that is movably coupled to the display system mounting member on the offset bracket such that the rotation bracket is configured to rotate relative to the offset bracket, wherein the rotation bracket includes:
      at least one display mounting element that is configured to couple to a display, wherein the movable coupling of the rotation bracket to the display system mounting member allows the display to rotate relative to the computing device when the computing device is mounted to the computing device mounting member and the display is coupled to the at least one display mounting element.

2. The system of claim 1, further comprising:
   a reduced-friction element that is included between the rotation bracket and the display system mounting member.

3. The system of claim 1, further comprising:
   a clamping plate that is mounted to the display system mounting member with the rotation bracket located between the clamping plate and the display mounting member and movable relative to the clamping plate and the display system mounting member.

4. The system of claim 3, further comprising:
   a reduced-friction element that is included between the clamping plate and the rotation bracket.

5. The system of claim 1, further comprising:
   a rotation stop member that is included on the rotation bracket and that is configured to limit the rotation of the rotation bracket relative to the offset bracket to a predefined arc length.

6. The system of claim 5, wherein the predefined arc length is ninety degrees.

7. An Information Handling System (IHS), comprising:
   a computing device including:
      a processing system; and
      a memory system that is coupled to the processing system and that includes instructions that, when executed by the processing system, cause the processing system to perform at least one computing operation;
   a display stand system;
   a display;
   an offset bracket that includes:
      a display system mounting member that is mounted to the display stand system; and a computing device mounting member that extends from the display system mounting member such that there is no relative movement between the display system mounting member and the computing device mounting member, wherein the computing device mounting member is mounted to the computing device such that movement of the computing device relative to the display system mounting member is prevented; and a rotation bracket that is movably coupled to the display system mounting member on the offset bracket such that the rotation bracket is configured to rotate relative to the offset bracket, wherein the rotation bracket includes:

at least one display mounting element that is coupled to the display, wherein the movable coupling of the rotation bracket to the display system mounting member allows the display to rotate relative to the computing device.

8. The IHS of claim 7, further comprising:
a reduced-friction element that is included between the rotation bracket and the display system mounting member.

9. The IHS of claim 7, further comprising:
a clamping plate that is mounted to the display system mounting member with the rotation bracket located between the clamping plate and the display mounting member and movable relative to the clamping plate and the display system mounting member.

10. The IHS of claim 9, further comprising:
a reduced-friction element that is included between the clamping plate and the rotation bracket.

11. The IHS of claim 7, further comprising:
a rotation stop member that is included on the rotation bracket and that is configured to limit the rotation of the rotation bracket relative to the offset bracket to a predefined arc length.

12. The IHS of claim 11, wherein the predefined arc length is ninety degrees.

13. The IHS of claim 7, further comprising:
a display stand system latching subsystem that is included on the display system mounting member and that is configured to couple the offset display system mounting member to the display stand system and decouple the offset display system mounting member from the display stand system without the use of tools.

14. A method for mounting a computing device to a display, comprising:

mounting, by an offset bracket that includes a display system mounting member, to a display stand system via the display system mounting member;

mounting, by the offset bracket that includes a computing device mounting member that extends from the display system mounting member such that there is no relative movement between the display system mounting member and the computing device mounting member, to a computing device via the computing device mounting member such that movement of the computing device relative to the display system mounting member is prevented;

coupling, by a rotation bracket that is movably coupled to the display system mounting member on the offset bracket and that includes at least one display mounting element, to the display via the at least one display mounting element; and rotating, by the rotation bracket, relative to the offset bracket in order to rotate the display relative to the computing device.

15. The method of claim 14, wherein the rotation of the rotation bracket relative to the offset bracket is facilitated by a reduced-friction element that is included between the rotation bracket and the display system mounting member.

16. The method of claim 14, wherein the rotation bracket is movably coupled to the display system mounting member on the offset bracket via a clamping plate that is mounted to the display system mounting member such that the rotation bracket is located between the clamping plate and the display mounting member and movable relative to the clamping plate and the display system mounting member.

17. The method of claim 16, wherein the rotation of the rotation bracket relative to the offset bracket is facilitated by a reduced-friction element that is included between the clamping plate and the rotation bracket.

18. The method of claim 14, further comprising:
limiting, by a rotation stop member that is included on the rotation bracket, the rotation of the rotation bracket relative to the offset bracket to a predefined arc length.

19. The method of claim 18, wherein the predefined arc length is ninety degrees.

20. The method of claim 14, further comprising:
coupling, by a display stand system latching subsystem that is included on the display system mounting member, the offset display system mounting member to the display stand system without the use of tools; and decoupling, by the display stand system latching subsystem, the offset display system mounting member from the display stand system without the use of tools.

* * * * *